US009443360B1

(12) United States Patent
Kwak

(10) Patent No.: US 9,443,360 B1
(45) Date of Patent: Sep. 13, 2016

(54) UNKNOWN ON-BOARD DIAGNOSTICS (OBD) PROTOCOL INTERPRETER AND CONVERSION SYSTEM

(71) Applicant: TrueLite Trace, Inc., Sunnyvale, CA (US)

(72) Inventor: Sung Bok Kwak, Cupertino, CA (US)

(73) Assignee: Truelite Trace, Inc., Sunnyvale, CA (US)

( * ) Notice: Subject to any disclaimer, the term of this patent is extended or adjusted under 35 U.S.C. 154(b) by 0 days.

(21) Appl. No.: 14/634,496

(22) Filed: Feb. 27, 2015

(51) Int. Cl.
*G07C 5/00* (2006.01)
*G01R 31/00* (2006.01)
*G07C 5/08* (2006.01)
*H04L 29/08* (2006.01)

(52) U.S. Cl.
CPC .............. *G07C 5/008* (2013.01); *G01R 31/006* (2013.01); *G07C 5/0808* (2013.01); *G07C 2205/02* (2013.01); *H04L 67/12* (2013.01)

(58) Field of Classification Search
CPC G07C 5/008; G07C 2205/02; G07C 5/0808; G01R 31/006; H04L 67/12; H04L 69/18
See application file for complete search history.

(56) References Cited

U.S. PATENT DOCUMENTS

| | | | |
|---|---|---|---|
| 6,295,492 B1 * | 9/2001 | Lang | G05B 15/02 340/425.5 |
| 6,529,808 B1 | 3/2003 | Diem | |
| 6,928,349 B1 * | 8/2005 | Namaky | G07C 5/0808 701/32.7 |
| 7,305,289 B2 * | 12/2007 | Gessner | B60R 16/0231 701/29.1 |
| 2005/0182535 A1 | 8/2005 | Huang | |
| 2008/0167772 A1 | 7/2008 | Du et al. | |
| 2009/0276115 A1 * | 11/2009 | Chen | G07C 5/008 701/29.6 |
| 2012/0245786 A1 * | 9/2012 | Fedorchuk | H04L 69/18 701/29.1 |

* cited by examiner

*Primary Examiner* — Michael J Zanelli
(74) *Attorney, Agent, or Firm* — Invent Capture, LLC.; Samuel S. Cho

(57) ABSTRACT

A novel on-board diagnostics (OBD) protocol interpreter and conversion system is capable of dynamically decoding commonly-known standard OBD formats as well as esoterically-customized and/or non-standard OBD formats that are initially unrecognized by a generic OBD data reader unit. The novel OBD protocol interpreter and conversion system includes an OBD protocol converter (OPC) unit that can be plugged to a vehicle OBD unit for seamlessly converting any types of standard and non-standard OBD formats to an OBD format compatible for real-time remote vehicle monitoring. For the esoterically-customized and/or non-standard OBD formats that cannot be decoded within the OPC alone, an unknown OBD protocol analysis module and a new OBD protocol interpreter development unit that are located remotely outside the vehicle can create installable new OBD interpreter codes, and update the OPC's OBD library and decoding units accordingly to enable seamless decoding of the esoterically-customized and/or non-standard OBD formats.

13 Claims, 4 Drawing Sheets

An Embodiment of an Unknown OBD Protocol Interpreter and Conversion System For Remote Vehicle OBD Monitoring

100

An Embodiment of an Unknown OBD Protocol Interpreter and Conversion System
For Remote Vehicle OBD Monitoring

100

A Data Flow Diagram for Dynamically Interpreting an Unknown OBD Protocol from a Vehicle in an OBD Protocol Interpreter and Conversion System

200

An Internal Components Diagram for an OPC Unit

300

UNKNOWN ON-BOARD DIAGNOSTICS (OBD) PROTOCOL INTERPRETER AND CONVERSION SYSTEM

BACKGROUND OF THE INVENTION

The present invention generally relates to remote real-time vehicle on-board diagnostics (OBD) monitoring. More specifically, various embodiments of the present invention relate to an on-board diagnostics (OBD) protocol interpreter and conversion system for decoding incompatible OBD output data from a vehicle OBD unit.

A modern vehicle manufactured in recent decades typically integrates an on-board diagnostics (OBD) unit, which is connected to an engine control unit (ECU), fuel consumption instruments, vehicle sensors, and other devices in the vehicle. As a factory-standard device at the point of vehicle manufacturing, the OBD unit was originally conceived to make vehicle maintenance, diagnostics, and repairs simpler at an authorized service facility that has a corresponding OBD data reader unit. A variety of OBD data formats have been developed in the past several decades, and many of them were originally intended to be standardized for OBD data reader compatibility among a plurality of OBD data readers. As a result, the Society of Automotive Engineers (SAE) and the International Organization for Standardization (ISO) have created numerous OBD data format standards, such as SAE J1850 PWM, SAE J1850 VPW, ISO 9141-2, ISO 14230-4, and ISO 15765-4, which are utilized for "OBD2" and "EOBD" regional standards. Furthermore, SAE J1939, SAE J1587, and SAE J1708 have been created for on-board diagnostics data readout from heavy duty trucks.

The usage of these existing OBD standards tends to be regionally fragmented, with some standards being more heavily utilized in one region (e.g. North America) over another (e.g. Europe). Furthermore, despite the original intent of compatibility for data readout regardless of particular names and makes of vehicles, many automakers customize OBD data formats to be maker-specific or even model-specific that can only be decoded properly by a corresponding maker-specific OBD reader device at a manufacturer-authorized service facility. For example, "2012-Mack-GU813E" is a Mack truck model-specific OBD protocol for use in Chile, and "2011-Mercedes Benz-Axor" is a Mercedes-specific OBD protocol for use in Brazil. These region and manufacturer-specific OBD protocols are typically not decipherable by a generic "universal" OBD data reader unit.

Thus, the pervasive practice of customizing OBD data formats by region and/or by automakers present significant challenges to a generic "universal" OBD data reader unit that attempts to decipher all types of OBD data formats, including the esoterically-customized OBD data by regions, makes, and models. The lack of OBD format compatibility may be especially problematic in a current automotive technological evolution for connected cars and remote vehicle monitoring, because a real-time OBD data readout for vehicle dynamics, fuel consumption, and condition analysis may require an integration or installation of a generic "universal" OBD data reader unit that can decode all kinds of OBD data formats, regardless of regions, makes, and models.

Therefore, it may be desirable to devise a novel OBD protocol interpreter and conversion system that can dynamically decode a known set of standard OBD formats as well as esoterically-customized and/or non-standard OBD formats that are unrecognized by a generic OBD data reader unit. Furthermore, it may also be desirable to devise an OBD protocol converter unit that can be plugged to a vehicle OBD unit for seamlessly converting any types of standard and non-standard OBD formats to an OBD format compatible for real-time remote vehicle monitoring. In addition, it may also be desirable to devise a method of processing a non-standard and/or unknown OBD protocol for correct decoding by the novel OBD protocol interpreter and conversion system.

SUMMARY

Summary and Abstract summarize some aspects of the present invention. Simplifications or omissions may have been made to avoid obscuring the purpose of the Summary or the Abstract. These simplifications or omissions are not intended to limit the scope of the present invention.

In one embodiment of the invention, an unknown on-board diagnostics (OBD) protocol interpreter and conversion system for remote vehicle OBD monitoring is disclosed. This unknown OBD protocol interpreter and conversion system comprises: a vehicle on-board diagnostics (OBD) unit connected to an engine control unit or a vehicular control chipset of a vehicle to record, diagnose, and generate vehicle speed data, acceleration and deceleration data, ambient air temperature data, and other vehicle diagnostics data as a raw OBD data stream; an on-board diagnostics (OBD) protocol converter unit connected to the vehicle on-board diagnostics unit, wherein the on-board diagnostics protocol converter unit is configured to decode an unknown OBD protocol to an OBD protocol library as well as a known OBD protocol to the OBD protocol library, wherein the unknown OBD protocol is correctly decoded by saving the raw OBD data stream, transmitting the raw OBD data stream and a request for analysis of the unknown OBD protocol to a remote monitoring station located remotely outside of the vehicle, receiving installable new OBD interpreter codes from a new OBD interpreter development unit in the remote monitoring station, and interpreting the unknown OBD protocol with the installable new OBD interpreter codes updated in the on-board diagnostics protocol converter unit; an on-board data transceiver unit connected to the on-board diagnostics protocol converter unit, wherein the on-board data transceiver unit is configured to transmit information to or receive the information from the new OBD interpreter development unit via a data communication network; and the data communication network configured to provide a wireless data information transfer between the OBD data transceiver unit and the on-board diagnostics protocol converter unit.

DETAILED DESCRIPTION

Figure 1:
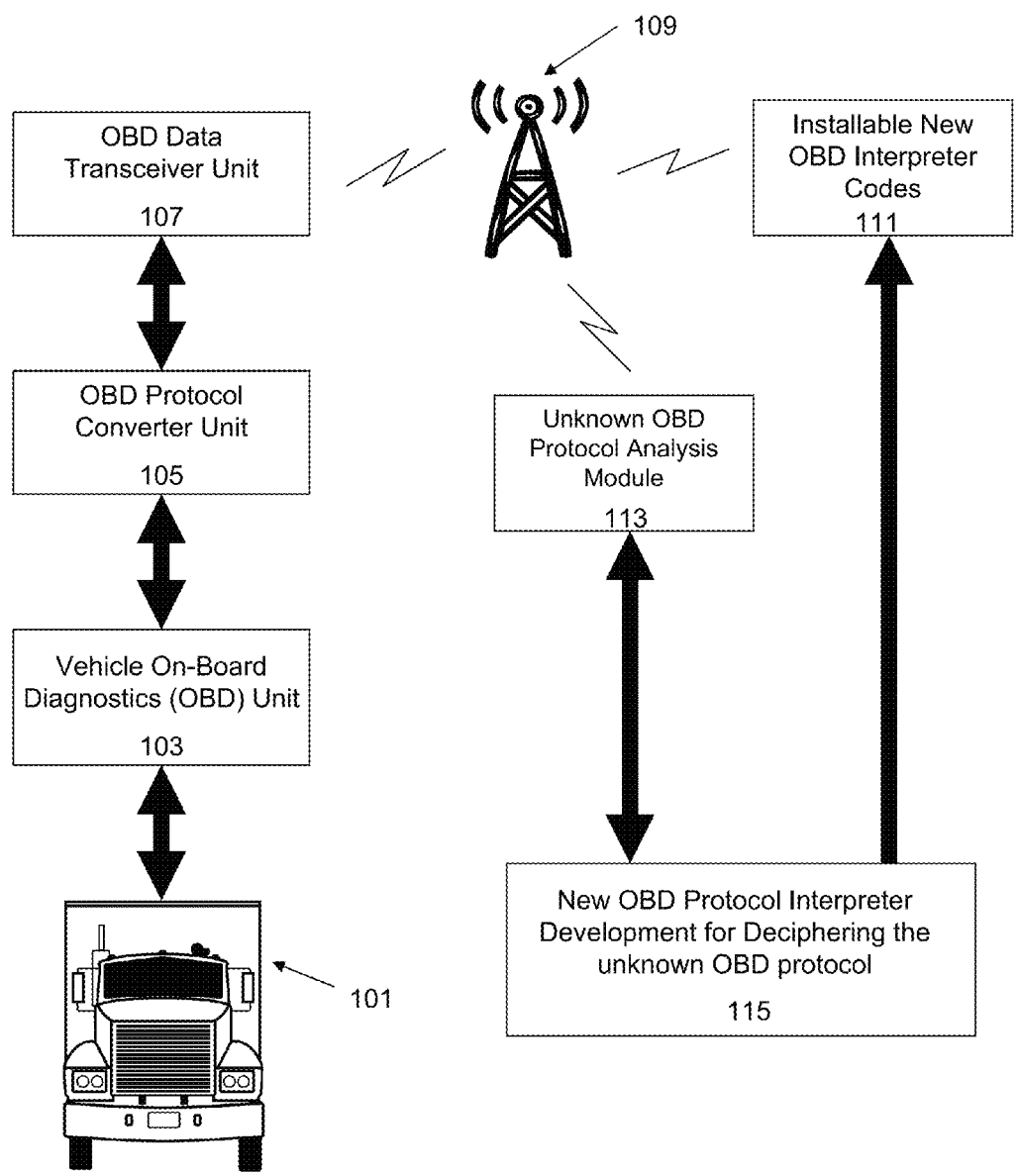
FIG. 1 shows an unknown on-board diagnostics (OBD) protocol interpreter and conversion system for remote vehicle OBD monitoring, in accordance with an embodiment of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

The detailed description is presented largely in terms of description of shapes, configurations, and/or other symbolic representations that directly or indirectly resemble one or more on-board diagnostics (OBD) interpreter and conversion systems, OBD protocol converter (OPC) units that operate within the OBD protocol interpreter and conversion systems, and one or more related methods of operation. These descriptions and representations are the means used by those experienced or skilled in the art to most effectively convey the substance of their work to others skilled in the art.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment. Furthermore, separate or alternative embodiments are not necessarily mutually exclusive of other embodiments. Moreover, the order of blocks in process flowcharts or diagrams representing one or more embodiments of the invention do not inherently indicate any particular order nor imply any limitations in the invention.

For the purpose of describing the invention, a term "vehicle on-board diagnostics (OBD) unit" is defined as an electronic device installed in a vehicle to collect and/or analyze a variety of vehicle-related data. In one example, the vehicle OBD unit outputs many data parameters in real-time, such as vehicle diagnostic information (e.g. engine temperature, oil level, OBD codes, and etc.), fuel consumption-related information, vehicle speed information, vehicle acceleration and deceleration information (i.e. measured in g-force or in SI units), ambient air temperature information, engine rotation-per-minute (RPM) information, vehicle location information, and other vehicle-related data. These data parameters may also be correlated to timestamps generated by an electronic clock associated with the vehicle OBD unit. In one embodiment of the invention, the data parameters may be generated by the vehicle OBD unit in a region-specific, maker-specific, and/or model-specific format, which requires interpretation and conversion to a compatible output format decodable by a remote vehicle OBD monitoring system.

Furthermore, for the purpose of describing the invention, a term "on-board diagnostics protocol converter unit," or "OPC," is defined as an electronic sub-system designed to detect, determine, and convert all types of OBD data formats, including "known" OBD protocols that are recognized by an existing library of OBD protocols accessed by the OPC, as well as "unknown" OBD protocols that cannot be decoded using the existing library of OBD protocols. The existing library of OBD protocols may contain one or more commonly-utilized and standardized OBD data format decoders and any related extension data format decoders. In one embodiment of the invention, the OPC may be a standalone dongle that plugs into a vehicle on-board diagnostics (OBD) unit and/or a generic or proprietary OBD data reader unit that analyzes and transmits real-time vehicle data information to a remote monitoring station unit outside the vehicle. In another embodiment of the invention, the OPC may be integrated into the vehicle on-board diagnostics (OBD) unit. The OPC and its internal components may comprise semiconductor chips and/or software executables stored in a memory unit or a data storage unit.

Furthermore, for the purpose of describing the invention, a term "remote monitoring station unit" is defined as a vehicle fleet monitoring location for one or more commercial vehicles in operation. Examples of remote monitoring station units include, but are not limited to, a commercial vehicle operation control center, a vehicle monitoring service center, and a fleet vehicle employer's information technology (IT) control center.

In addition, for the purpose of describing the invention, a term "computer server" is defined as a physical computer system, another hardware device, a software module executed in an electronic device, or a combination thereof. Furthermore, in one embodiment of the invention, a computer server is connected to one or more data networks, such as a local area network (LAN), a wide area network (WAN), a cellular network, and the Internet. Moreover, a computer server can be utilized by a vehicle monitoring personnel for gathering and analyzing vehicle-related data by executing a vehicle condition analytics unit and a vehicle information database.

One aspect of the present invention is providing a novel OBD protocol interpreter and conversion system that can dynamically decode commonly-known standard OBD formats as well as esoterically-customized and/or non-standard OBD formats that are initially unrecognized by a generic OBD data reader unit connected to the novel OBD protocol interpreter and conversion system.

Furthermore, another aspect of the present invention is providing an OBD protocol converter unit that can be plugged to a vehicle OBD unit for seamlessly converting any types of standard and non-standard OBD formats to an OBD format compatible for real-time remote vehicle monitoring.

Moreover, another aspect of the present invention is providing a method of processing a non-standard and/or unknown OBD protocol for correct decoding by the novel OBD protocol interpreter and conversion system.

FIG. 1 shows an unknown on-board diagnostics (OBD) protocol interpreter and conversion system (100) for remote vehicle OBD monitoring, in accordance with an embodiment of the invention. In a preferred embodiment of the invention, the unknown on-board diagnostics (OBD) protocol interpreter and conversion system (100) comprises a vehicle on-board diagnostics (OBD) unit (103), an OBD protocol converter unit (i.e. also referred herein as the "OPC") (105), an OBD data transceiver unit (107), a data communication network (109), an unknown OBD protocol analysis module (113), a new OBD protocol interpreter development unit for deciphering the unknown OBD protocol (115), and installable new OBD interpreter codes (111).

In the preferred embodiment of the invention as shown in FIG. 1, the vehicle on-board diagnostics (OBD) unit (103), the OBD protocol converter unit (105), and the OBD data transceiver unit (107) are typically installed inside a vehicle (101), such as a truck, a van, a bus, a taxi, a passenger car, or another automobile. Furthermore, the vehicle OBD unit (103) is typically a standard factory-installed device at the point of auto manufacturing, with OBD data outputs designed to inform a driver or an auto mechanic vehicle-related data parameters through the vehicle's instrument panel or through a maker-specific, region-specific, and/or model-specific vehicle diagnostics machine. The vehicle OBD unit (103) is also typically connected to an engine control unit and other vehicular control chipsets to record, diagnose, and generate a variety of engine, vehicle dynamics, and fuel consumption data as a real-time data stream. This real-time data stream from the vehicle OBD unit (103) can be transmitted remotely to a remote monitoring station unit outside the vehicle for remote real-time vehicle condition and fuel consumption analysis, after a data format interpretation and conversion of a native and raw OBD data format from the vehicle OBD unit (103) to a standardized and compatible OBD data format that the remote monitoring station unit can properly comprehend for data analysis. Some vehicle OBD units may generate commonly-known standard OBD format data, while other vehicle OBD units may generate highly-customized, non-standard, region-specific, and/or manufacturer-specific OBD format data that are not readily decodable with a standard OBD decoding library in a generic OBD data reader unit. In the preferred embodiment of the invention, the data format interpretation and conversion is performed in part by the OPC (105) and also in part by the unknown OBD protocol analysis module (113) and the new OBD protocol interpreter development unit (115), if a detailed interpretation of non-standard codes is necessary before data conversion by the OPC (105).

Continuing with FIG. 1, the OBD protocol converter unit, or the "OPC," (105) is an electronic sub-system, which is designed to detect, determine, and convert all types of OBD data formats. The OPC (105) is configured to process and decode "known" OBD protocols that are recognized by an existing library of OBD protocols accessed by the OPC (105). More importantly, the OPC (105) is also capable of processing and eventually decoding "unknown" OBD protocols that cannot be decoded using the existing library of OBD protocols. In one embodiment of the invention, the OPC (105) may be a standalone dongle that plugs into the vehicle OBD unit (103) and/or a generic or proprietary OBD data reader unit that analyzes and transmits real-time vehicle data information to a remote monitoring station unit outside the vehicle. In another embodiment of the invention, the OPC (105) may be integrated into the vehicle OBD unit (103). Furthermore, the OPC (105) and its internal components may comprise semiconductor chips and/or software executables stored in a memory unit or a data storage unit.

In the preferred embodiment of the invention as shown in FIG. 1, the eventual decoding of unknown OBD protocols in the OPC (105) is accomplished by locally storing a sampled stream of an unknown OBD protocol generated by the vehicle OBD unit (103), after which the sampled stream, a request for an unknown OBD protocol analysis, and a corresponding OPC decoder update request for new OBD protocol interpreter codes are wirelessly transmitted to the unknown OBD protocol analysis module (113) located remotely outside the vehicle. In the preferred embodiment, the wireless transmission of the sampled stream of an unknown OBD protocol from the OPC (105) utilizes the OBD data transceiver unit (107) installed in the vehicle (101) and the data communication network (109), which may be any combination of cellular, satellite, land-mobile radio, landline, or another data communication medium.

Once the unknown OBD protocol analysis module (113) located remotely outside the vehicle receives the sampled stream of the unknown OBD protocol, the request for the unknown OBD protocol analysis, and the corresponding OPC decoder update request for new OBD protocol interpreter codes from the OPC (105), the unknown OBD protocol analysis module (113) can provide computerized analysis and preliminary evaluation of the unknown OBD protocol to the new OBD protocol interpreter development unit (115) for deciphering the unknown OBD protocol. In one embodiment of the invention, the new OBD protocol interpreter development unit (115) comprises one or more firmware software engineers capable of creating new OBD interpreter codes by inspecting the sampled stream of the unknown OBD protocol and by utilizing the computerized analysis and preliminary evaluation of the unknown OBD protocol from the unknown OBD protocol analysis module (113). In another embodiment of the invention, the new OBD protocol interpreter development unit (115) is a machine-learning module with artificial intelligence operating on a computer server, which can autonomously generate the new OBD interpreter codes without human intervention by comparing one or more standardized OBD parameter formats known to the machine-learning module, the sampled stream of the unknown OBD protocol, and the computerized analysis and preliminary evaluation of the unknown OBD protocol from the unknown OBD protocol analysis module (113).

The new OBD interpreter codes created from the new OBD protocol interpreter development unit (115) are then packaged, modified, and transmitted as the installable new OBD interpreter codes (111) to the OPC (105), which subsequently performs a firmware update or a decoder update to one or more modules in the OPC (105). In one embodiment of the invention, a first OBD interpreter chip is utilized in the OPC (105) for decoding a known set of standard OBD data formats with a standard OBD format library, while a second OBD interpreter chip is utilized in the OPC (105) for decoding an unknown set of non-standard OBD data formats after requesting, downloading, and incorporating the installable new OBD interpreter codes (111) from the new OBD protocol interpreter development unit (115) through the data communication network (109) and the OBD data transceiver unit (107). Once the installable new OBD interpreter codes (111) are downloaded and updated in the second OBD interpreter chip, a dynamic OBD library associated with the first and/or the second OBD interpreter chips may also be updated to recognize and readily decode the previously-unknown OBD data format without requesting assistance to the new OBD protocol interpreter development unit (115) in the future.

In another embodiment of the invention, a single OBD interpreter chip in the OPC (105) may be capable of processing and decoding both the known set and the unknown set of OBD data formats by accessing the standard OBD format library in case of decoding of the known set of OBD data formats, and by requesting, downloading, and incorporating the installable new OBD interpreter codes (111) in case of decoding of the unknown set of OBD data formats. Yet in another embodiment of the invention, the OPC (105) may exist entirely or at least partly as one or more software modules executed in a memory unit and a CPU of an OBD data reader or another computing unit, with the novel capability to process and decode both the known set and the unknown set of OBD data formats using the OBD data transceiver unit (107), the data communication network (109), the unknown OBD protocol analysis module (113), the new OBD protocol interpreter development unit (115), and the installable new OBD interpreter codes (111), as described in other embodiments of the invention.

Figure 2:
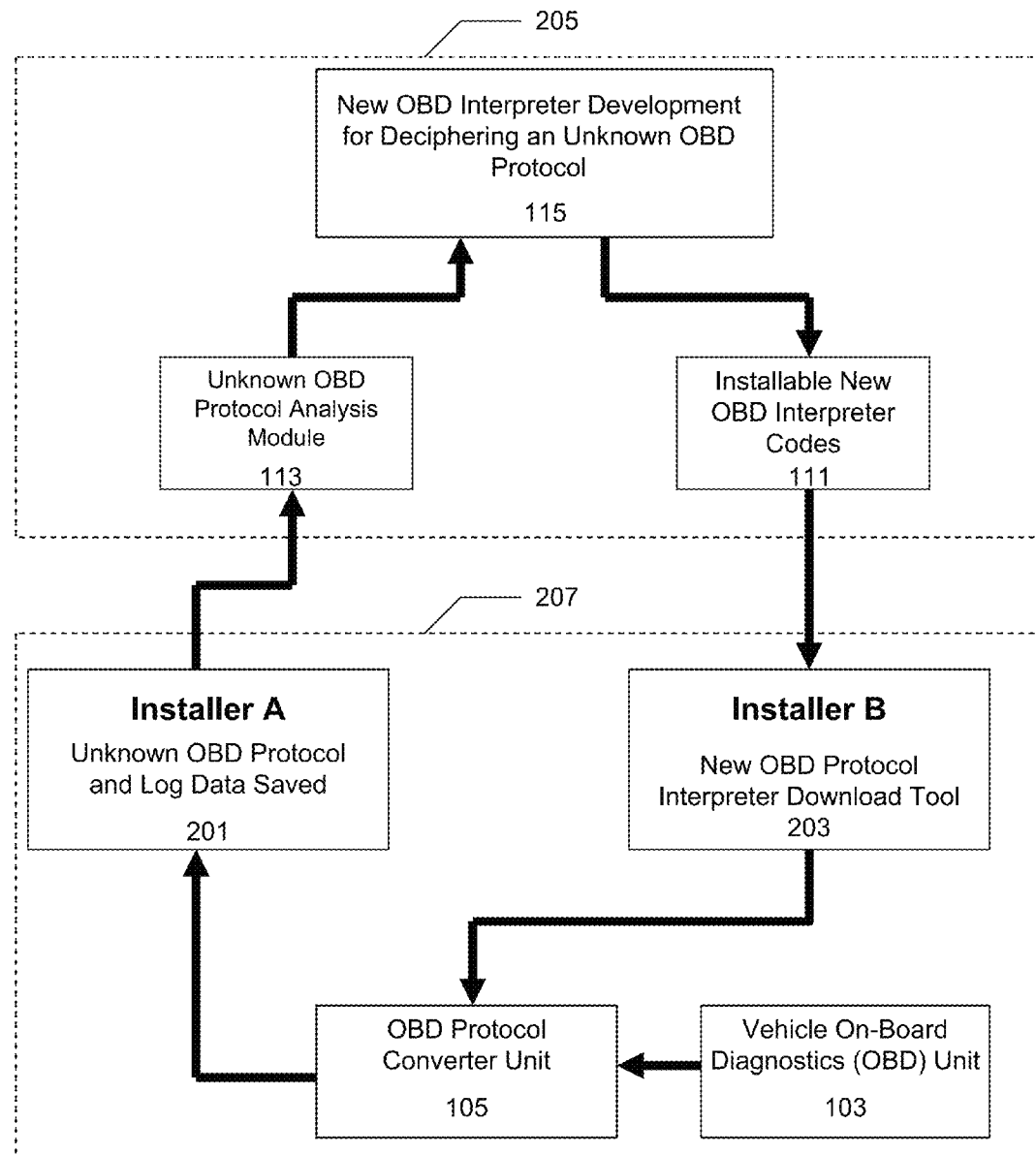
FIG. 2 shows a data flow diagram for dynamically interpreting an unknown on-board diagnostics (OBD) protocol from a vehicle in an OBD protocol interpreter and conversion system, in accordance with an embodiment of the invention.

FIG. 2 shows a data flow diagram (200) for dynamically interpreting an unknown on-board diagnostics (OBD) protocol from a vehicle in an OBD protocol interpreter and conversion system, in accordance with an embodiment of the invention. In this embodiment, in-vehicle functional components (207) for dynamically interpreting the unknown OBD protocol comprise a vehicle on-board diagnostics (OBD) unit (103), an OBD protocol converter unit (105), an "Installer A" unit (201), and an "Installer B" unit (203), as shown in FIG. 2. Furthermore, external components (205) that are located remotely away from the vehicle comprise an unknown OBD protocol analysis module (113), a new OBD interpreter development unit (115) for deciphering the unknown OBD protocol, and installable new OBD interpreter codes (111), as also shown in FIG. 2. The external components (205) may be part of a remote monitoring station unit, which is intended to monitor and analyze vehicle dynamics, fuel consumption, safety, and other vehicular data parameters generated by the vehicle OBD unit (103) in real-time.

As shown by the data flow diagram (200) in this embodiment of the invention, the vehicle on-board diagnostics (OBD) unit (103) first generates native and "raw" OBD data outputs. The native and raw OBD data outputs from the vehicle OBD unit (103) may be incomprehensible or incompatible to an OBD decoding scheme utilized by a generic (i.e. not specific to a particular model, make, and/or region) OBD data reader unit, because the native and raw OBD data outputs may have been originally intended to be decoded only by a make and/or vehicle-specific diagnostic machine.

In accordance with an embodiment of the invention, the native and raw OBD data outputs from the vehicle OBD unit (103) are fed into the OBD protocol converter (OPC) unit (105), which is typically installed as an aftermarket unit inside a vehicle. The OPC (105) is a novel electronic sub-system, and is uniquely designed to detect, determine, and convert all types of OBD data formats. The OPC (105) is configured to process and decode "known" OBD protocols that are recognized by an existing library of OBD protocols accessed by the OPC (105). The existing library of OBD protocols may contain one or more commonly-utilized and standardized OBD data format decoders and any related extension data format decoders. Furthermore, the OPC (105) is also capable of processing and eventually decoding "unknown" OBD protocols that cannot be decoded using the existing library of OBD protocols. An OBD protocol is determined by the OPC (105) to be "unknown," if the OBD protocol does not match a data format stored in a standard OBD format library. A sample stream of the unknown OBD protocol and its related log data are then stored in a local memory unit or a data storage associated with the OPC (105). In the preferred embodiment of the invention, the saved sample stream of the unknown OBD protocol and its related log data are associated with the "Installer A" unit (201), as shown in FIG. 2.

In one embodiment of the invention, the "Installer A" unit (201) may be a firmware update management and transmission module executed by a memory unit and a CPU in the OPC (105). In another embodiment of the invention, the "Installer A" unit (201) may be a semiconductor chip or another hardware component functioning as a dedicated firmware update chip. The "Installer A" unit (201) is configured to transmit the saved sample stream of the unknown OBD protocol and the related log data to the external components (205) through a data communication network (e.g. 109 of FIG. 1), along with a request for an unknown OBD protocol analysis and a corresponding OPC decoder update request for new OBD protocol interpreter codes. In the preferred embodiment, vehicle-identifying and OPC-identifying information are also transmitted to the external components (205), when the saved sample stream of the unknown OBD protocol and the related log data are transmitted.

Then, as shown in FIG. 2, once the unknown OBD protocol analysis module (113) located remotely outside the vehicle receives the saved sample stream of the unknown OBD protocol, the request for the unknown OBD protocol analysis, and the corresponding OPC decoder update request for new OBD protocol interpreter codes from the OPC (105), the unknown OBD protocol analysis module (113) can provide computerized analysis and preliminary evaluation of the unknown OBD protocol to the new OBD protocol interpreter development unit (115) for deciphering the unknown OBD protocol. For example, the unknown OBD protocol analysis module (113) may compare and contrast data format differences between the saved sample stream of the unknown OBD protocol and one or more commonly-known standardized OBD formats that are likely to be a base data structure for formulation of the unknown OBD protocol by a particular auto manufacturer. The unknown OBD protocol analysis module (113) may also determine a likely base data structure format for the unknown OBD protocol by comparing the vehicle model and make information in the vehicle OBD unit (103) fetched from the OPC (105) against a database of regional OBD data customizations by auto manufacturers.

In one embodiment of the invention, the new OBD protocol interpreter development unit (115) includes one or more software engineers who are capable of creating new OBD interpreter codes by inspecting the sampled stream of the unknown OBD protocol and by utilizing the computerized analysis and preliminary evaluation of the unknown OBD protocol from the unknown OBD protocol analysis module (113). In another embodiment of the invention, the new OBD protocol interpreter development unit (115) is a machine-learning module with artificial intelligence, which can autonomously generate the new OBD interpreter codes without human intervention by comparing one or more standardized OBD parameter formats known to the machine-learning module, the sampled stream of the unknown OBD protocol, and the computerized analysis and preliminary evaluation of the unknown OBD protocol from the unknown OBD protocol analysis module (113).

The new OBD interpreter codes created from the new OBD protocol interpreter development unit (115) are then packaged, modified, and transmitted as the installable new OBD interpreter codes (111) to the "Installer B" unit (203) associated with the OPC (105) in the in-vehicle functional components (207). The "Installer B" unit (203) is a download tool for the new OBD protocol interpreter, and the OPC (105) subsequently performs a firmware update or a decoder update to one or more modules in the OPC (105). In one embodiment of the invention, a first OBD interpreter chip is utilized in the OPC (105) for decoding a known set of standard OBD data formats with a standard OBD format library, while a second OBD interpreter chip is utilized in the OPC (105) for decoding an unknown set of non-standard OBD data formats after requesting, downloading, and incorporating the installable new OBD interpreter codes (111) from the new OBD protocol interpreter development unit (115) through the data communication network (e.g. 109 in FIG. 1) and the OBD data transceiver unit (e.g. 107 in FIG. 1). Once the installable new OBD interpreter codes (111) are downloaded and updated in the second OBD interpreter chip, a dynamic OBD library associated with the first and/or the second OBD interpreter chips may also be updated to recognize and readily decode the previously-unknown OBD data format without requesting assistance to the new OBD protocol interpreter development unit (115) in the future.

In another embodiment of the invention, a single OBD interpreter chip in the OPC (105) may be capable of processing and decoding both the known set and the unknown set of OBD data formats by accessing the standard OBD format library in case of decoding of the known set of OBD data formats, and by requesting, downloading, and incorporating the installable new OBD interpreter codes (111) in case of decoding of the unknown set of OBD data formats. Yet in another embodiment of the invention, the OPC (105) may exist entirely or at least partly as one or more software modules executed in a memory unit and a CPU of an OBD data reader or another computing unit, with the novel capability to process and decode both the known set and the unknown set of OBD data formats using the OBD data transceiver unit (e.g. 107 in FIG. 1), the data communication network (e.g. 109 in FIG. 1), the unknown OBD protocol analysis module (113), the new OBD protocol interpreter development unit (115), and the installable new OBD interpreter codes (111), as described in other embodiments of the invention.

Figure 3:
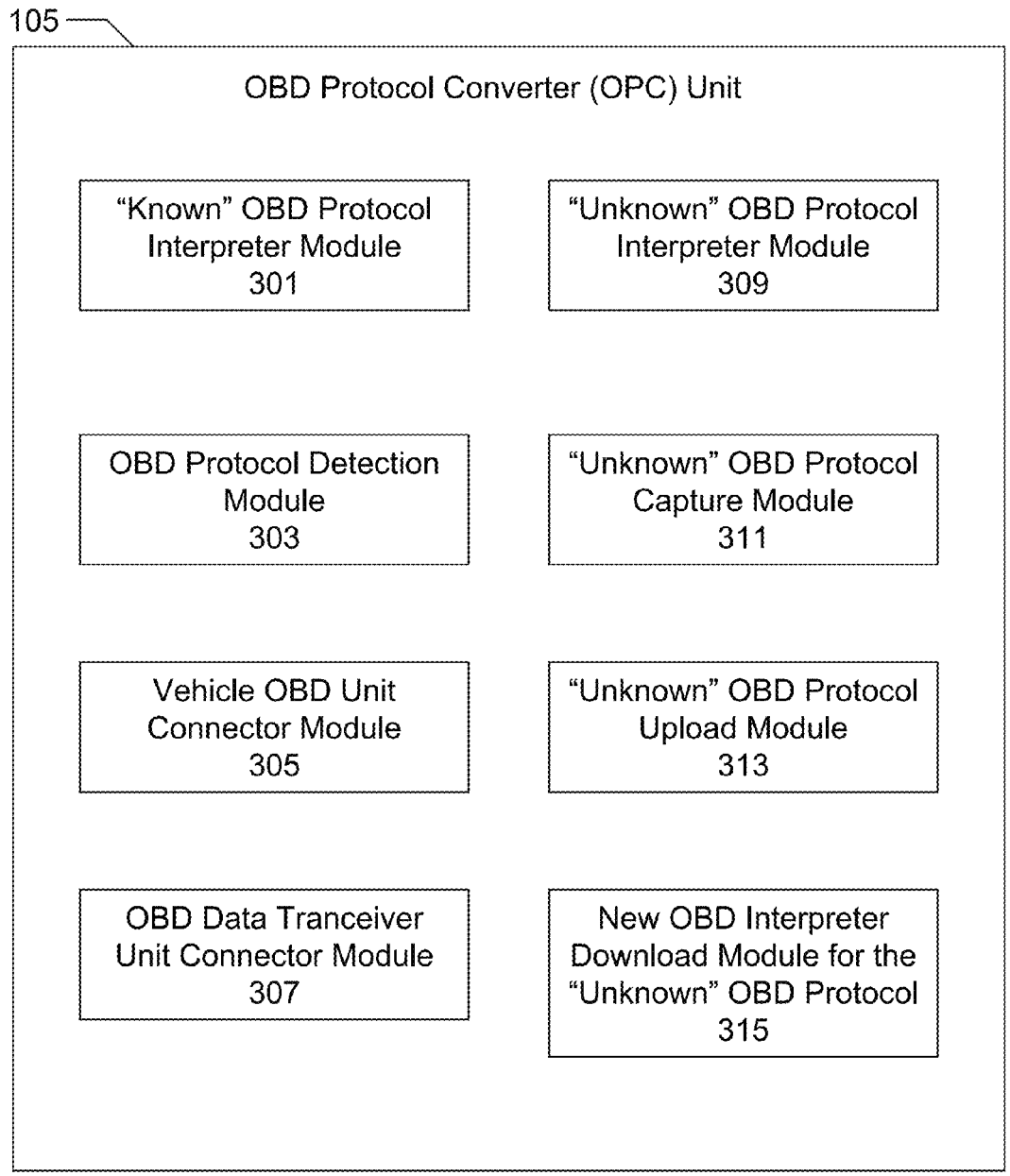
FIG. 3 shows an internal components diagram for an on-board diagnostics protocol converter (OPC) unit, in accordance with an embodiment of the invention.

FIG. 3 shows an internal components diagram (300) for an on-board diagnostics protocol converter (OPC) unit (105), in accordance with an embodiment of the invention. In this embodiment of the invention, the internal components of the OPC (105) comprise a "known" OBD protocol interpreter module (301), an OBD protocol detection module (303), a vehicle OBD unit connector module (305), an OBD data transceiver unit connector module (307), an "unknown" OBD protocol interpreter module (309), an "unknown" OBD protocol capture module (311), an "unknown" OBD protocol upload module (313), and a new OBD interpreter download module for the "unknown" OBD protocol (315). As described previously in association with FIGS. 1-2, the OPC (105) is a novel electronic sub-system capable of detecting, determining, and converting all types of OBD data formats. First, the OPC (105) plugs into a vehicle OBD unit through an OBD connector, and the vehicle OBD unit connector module (305) is a data interface unit configured to receive and transmit information between the OPC (105) and the vehicle OBD unit.

Then, the OPC (105) further processes an incoming OBD data stream received by the vehicle OBD unit connector module (305) in the OBD protocol detection module (303) by comparing an existing library of "known" OBD protocols in a memory unit or a data storage of the OPC (105) with the incoming OBD data stream. The OBD protocol detection module (303) may be able to readily detect and determine a specific OBD data format for the incoming OBD data stream, if there is a match between the incoming OBD data stream and the existing library of "known" OBD protocols in the memory unit or the data storage of the OPC (105). If the incoming OBD data stream is determined to be a "known" OBD protocol, then the "known" OBD protocol interpreter module (301), at its discretion, can convert the incoming OBD data stream into a more convenient OBD data format for communication with the rest of the system.

For example, the "known" OBD protocol interpreter module (301) may want to convert the incoming OBD data stream into a different OBD protocol format for a seamless data analysis compatibility in the remote monitoring station for vehicle dynamics, fuel consumption, and safety monitoring. Alternatively, if the incoming OBD data stream is already in a recognized data format for the rest of the system (e.g. various components in the remote monitoring station), then the "known" OBD protocol interpreter module (301), at its discretion, may simply transmit the incoming OBD data stream to the remote monitoring station through the OBD data transceiver unit connector module (307) in the OPC (105), which is operatively connected to the OBD data transceiver unit (e.g. 107 in FIG. 1).

On the other hand, if there is no match or association between the incoming OBD data stream and the existing library of "known" OBD protocols in the memory unit or the data storage of the OPC (105), the OBD protocol detection module (303) determines that the incoming OBD data stream is an "unknown" OBD data protocol, and forwards the incoming OBD data stream to the "unknown" OBD protocol capture module (311). In one embodiment of the invention, the "unknown" OBD protocol capture module (311) in the OPC (105) stores the incoming OBD data stream in a local memory unit or a data storage, and then prompts the "unknown" OBD protocol upload module (313) to transmit the saved incoming OBD data stream, a request for an unknown OBD protocol analysis, and a corresponding OPC decoder update request for new OBD protocol interpreter codes to an external component, such as the unknown OBD protocol analysis module (e.g. 113 in FIG. 1) located remotely outside the vehicle.

In one embodiment of the invention, the transmission of the saved incoming OBD data stream and the new interpreter codes requests is performed through a vehicle-integrated OBD data transceiver unit (e.g. 107 in FIG. 1) and a data communication network (e.g. 109 in FIG. 1), which may be any combination of cellular, satellite, land-mobile radio, landline, or another data communication medium. Once the unknown OBD protocol analysis module (e.g. 113 in FIG. 1) located remotely outside the vehicle receives the saved incoming OBD data stream and the new interpreter codes requests, the unknown OBD protocol analysis module (e.g. 113 in FIG. 1) can provide computerized analysis and preliminary evaluation of the unknown OBD protocol to the new OBD protocol interpreter development unit (e.g. 115 in FIG. 1) for deciphering the unknown OBD protocol.

The new OBD protocol interpreter development unit (e.g. 115 in FIG. 1) then creates new OBD interpreter codes by inspecting a sampled stream of the unknown OBD protocol and by utilizing the computerized analysis and preliminary evaluation of the unknown OBD protocol from the unknown OBD protocol analysis module (e.g. 113 in FIG. 1). Then, the new OBD interpreter codes created from the new OBD protocol interpreter development unit (e.g. 115 in FIG. 1) are then packaged, modified, and transmitted as the installable new OBD interpreter codes (e.g. 111 in FIG. 1) to the new OBD interpreter download module (315) in the OPC (105), as shown in FIG. 3. The new OBD interpreter download module (315) integrates or is associated with an installer unit (e.g. the "Installer B" unit (203)) for performing a firmware update or a decoder update to the "unknown" OBD protocol interpreter module (309) in the OPC (105). The "unknown" OBD protocol interpreter module (309) is configured to contain a new OBD data format decoder created from the installable new OBD interpreter codes (e.g. 111 in FIG. 1), which are downloaded from the new OBD protocol interpreter development unit (e.g. 115 in FIG. 1). The "unknown" OBD protocol interpreter module (309) can also build a new OBD data format library with multiple types of new OBD interpreter codes downloaded from the new OBD protocol interpreter development unit (e.g. 115 in FIG. 1) through a multiple number of unknown OBD protocol encounters from the incoming OBD data stream.

In one embodiment of the invention, various modules contained in the OPC (105) may be implemented on one or more semiconductor chips. In another embodiment of the invention, various modules contained in the OPC (105) may be implemented as software modules, which are executable on a CPU and a memory unit of the OPC (105) or another electronic system. Yet in another embodiment of the invention, various modules contained in the OPC (105) may be implemented as a combination of hardware and software modules. Furthermore, the functionality of each module shown in the internal components diagram (300) may be combined or integrated in a smaller or larger number of hardware and/or software modules.

Figure 4:
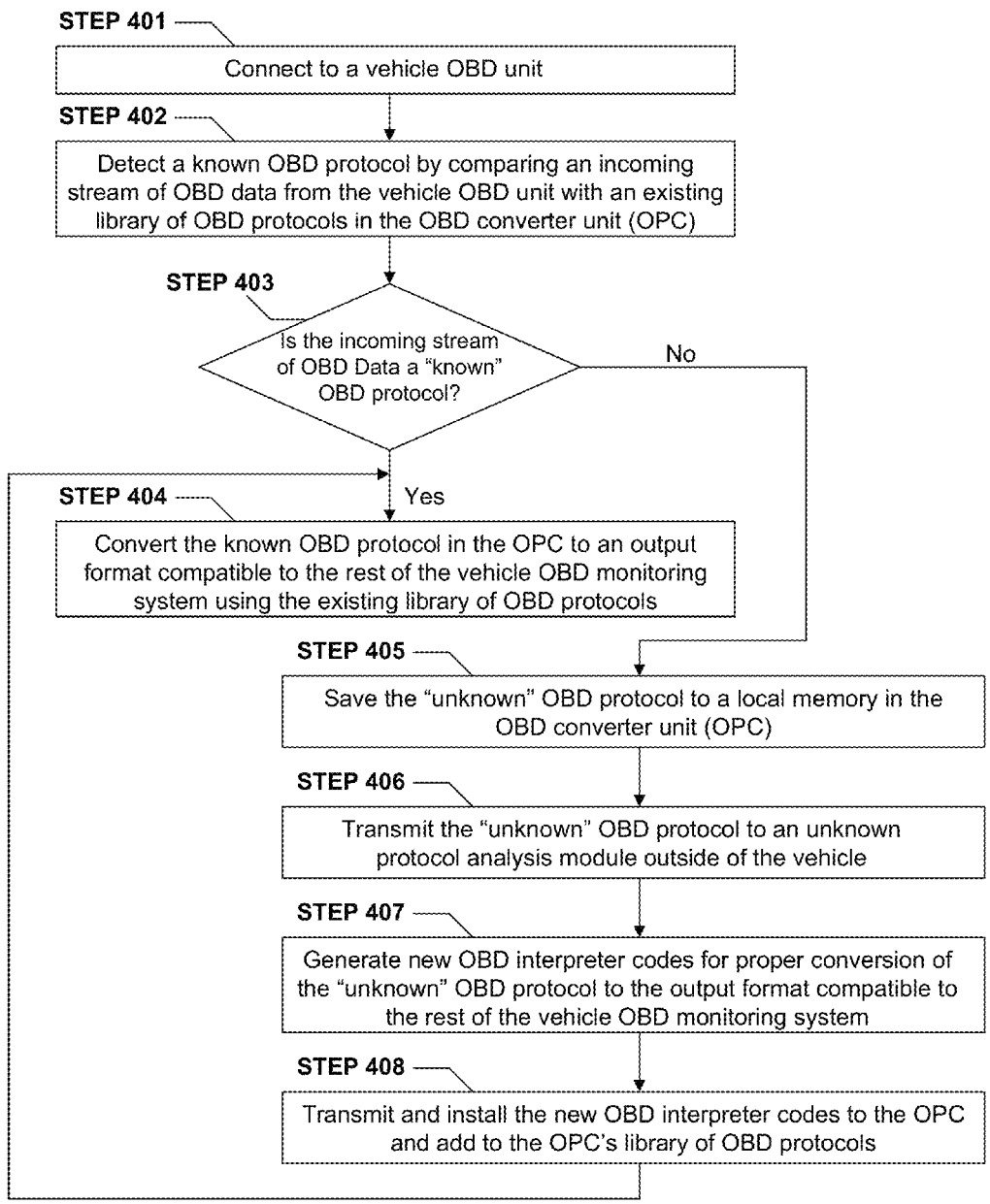
FIG. 4 shows an operational flowchart for an unknown on-board diagnostics (OBD) interpreter and conversion system for remote vehicle OBD monitoring, in accordance with an embodiment of the invention.

FIG. 4 shows an operational flowchart (400) for an unknown on-board diagnostics (OBD) protocol interpreter and conversion system for remote vehicle OBD monitoring, in accordance with an embodiment of the invention. In this embodiment of the invention, an OBD protocol converter unit (OPC) is first plugged into a vehicle OBD unit using a data connector, as shown in STEP 401. Then, the OPC attempts to detect a known OBD protocol by comparing an incoming stream of OBD data from the vehicle OBD unit with an existing library of OBD protocols in the OPC, as shown in STEP 402.

If the OPC cannot find a suitable match between the existing library of OBD protocols and the incoming stream of OBD data from the vehicle OBD unit, as shown in STEP 403, then the OPC determines that the incoming stream of OBD data is an unknown OBD protocol. Subsequently, the OPC saves the incoming stream of the unknown OBD protocol to a local memory or another data storage in the OPC, as shown in STEP 405. A sample of the unknown OBD protocol stream is then wirelessly transmitted to an unknown protocol analysis module, which is remotely located outside the vehicle, as shown in STEP 406. With a computerized analytical output from the unknown protocol analysis module and new codes development from a new OBD interpreter development unit, new OBD interpreter codes are created for proper conversion of the unknown OBD protocol to an output format compatible to various components of the vehicle OBD monitoring system, as shown in STEP 407.

The new OBD interpreter development unit then transmits the new OBD interpreter codes to the OPC, which subsequently utilizes an installer tool to install the new OBD interpreter codes and update the OPC's library of OBD protocols, as shown in STEP 408. Then, the OPC is now capable of decoding what was previously determined as the "unknown" OBD protocol by accessing the new OBD interpreter codes in the OPC's updated library of OBD protocols. The OPC can generate a preferred data output format compatible to the rest of the vehicle OBD monitoring system using the updated library of OBD protocols, as shown in STEP 404.

Continuing with the operational flowchart (400) in FIG. 4, if the incoming stream of OBD data at STEP 403 was initially determined as a "known" OBD protocol based on a successful matching between the existing library of OBD protocols and the incoming stream of OBD data, then the OPC can proceed straight to STEP 404, instead of taking STEPs 405~408 first, to convert the known OBD protocol in the OPC to a preferred output format compatible to the rest of the vehicle OBD monitoring system using the existing library of OBD protocols.

Various embodiments of the present invention provide several key advantages over conventional OBD data readout methods using a maker-specific, region-specific, and/or model-specific proprietary diagnostic reader or a generic conventional OBD data reader. One advantage of an embodiment of the present invention is providing a novel OBD protocol interpreter and conversion system that can dynamically decode commonly-known standard OBD formats as well as esoterically-customized and/or non-standard OBD formats that are initially unrecognized by a generic OBD data reader unit connected to the novel OBD protocol interpreter and conversion system.

Furthermore, another advantage of an embodiment of the present invention is providing an OBD protocol converter unit that can be plugged to a vehicle OBD unit for seamlessly converting any types of standard and non-standard OBD formats to an OBD format compatible for real-time remote vehicle monitoring. Moreover, another advantage of an embodiment of the present invention is providing a method of processing a non-standard and/or unknown OBD protocol for correct decoding by the novel OBD protocol interpreter and conversion system.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An unknown on-board diagnostics (OBD) protocol interpreter and conversion system for remote vehicle OBD monitoring, the unknown OBD protocol interpreter and conversion system comprising:

a vehicle on-board diagnostics (OBD) unit connected to an engine control unit or a vehicular control chipset of a vehicle to record, diagnose, and generate vehicle speed data, acceleration and deceleration data, ambient air temperature data, and other vehicle diagnostics data as a raw OBD data stream;

an on-board diagnostics (OBD) protocol converter unit connected to the vehicle on-board diagnostics unit, wherein the on-board diagnostics protocol converter unit is configured to decode an unknown OBD protocol to an OBD protocol library as well as a known OBD protocol to the OBD protocol library, wherein the unknown OBD protocol is correctly decoded by saving the raw OBD data stream, transmitting the raw OBD data stream and a request for analysis of the unknown OBD protocol to a remote monitoring station located remotely outside of the vehicle, receiving installable new OBD interpreter codes from a new OBD interpreter development unit, which is a machine-learning module with artificial intelligence in the remote monitoring station, and interpreting the unknown OBD protocol with the installable new OBD interpreter codes updated in the on-board diagnostics protocol converter unit;

an on-board data transceiver unit connected to the on-board diagnostics protocol converter unit, wherein the on-board data transceiver unit is configured to transmit information to or receive the information from the new OBD interpreter development unit via a data communication network; and the data communication network configured to provide a wireless data information transfer between the OBD data transceiver unit and the on-board diagnostics protocol converter unit.

2. The unknown on-board diagnostics (OBD) protocol interpreter and conversion system of claim 1, further comprising an unknown OBD protocol analysis module connected to the new OBD interpreter development unit in the remote monitoring station, wherein the unknown OBD protocol analysis module generates a preliminary comparison between a data format of the unknown OBD protocol sent by the vehicle on-board diagnostics protocol converter unit and another data format of a standardized OBD protocol.

3. The unknown on-board diagnostics (OBD) protocol interpreter and conversion system of claim 1, wherein the on-board diagnostics protocol converter unit includes an OBD protocol detection module, a known OBD protocol interpreter module, an unknown OBD protocol capture module, an unknown OBD protocol upload module, a new OBD interpreter download module for the unknown OBD protocol, an unknown OBD protocol interpreter module, a vehicle OBD unit connector module, and an OBD data transceiver unit connector module.

4. The unknown on-board diagnostics (OBD) protocol interpreter and conversion system of claim 3, wherein the on-board diagnostics protocol converter unit further includes a memory unit and a CPU to execute one or more modules in the on-board diagnostics protocol converter unit.

5. The unknown on-board diagnostics (OBD) protocol interpreter and conversion system of claim 1, wherein the on-board diagnostics protocol converter unit includes an installer unit for incorporating the installable new OBD interpreter codes in the OBD protocol library.

6. The unknown on-board diagnostics (OBD) protocol interpreter and conversion system of claim 1, wherein the on-board diagnostics protocol converter unit detects the known OBD protocol to the OBD protocol library by comparing the raw OBD data stream received from the vehicle on-board diagnostics unit with a plurality of OBD data formats in the OBD protocol library, and finding a successful match for a particular OBD data format.

7. The unknown on-board diagnostics (OBD) protocol interpreter and conversion system of claim 6, wherein the on-board diagnostics protocol converter unit decodes the known OBD protocol by utilizing a decoder of the particular OBD data format that matched correctly with the raw OBD data stream.

8. The unknown on-board diagnostics (OBD) protocol interpreter and conversion system of claim 1, wherein the on-board diagnostics protocol converter unit detects the unknown OBD protocol to the OBD protocol library by comparing the raw OBD data stream received from the vehicle on-board diagnostics unit with a plurality of OBD data formats in the OBD protocol library, and then failing to find a successful match between the raw OBD data stream and the plurality of OBD data formats.

9. The unknown on-board diagnostics (OBD) protocol interpreter and conversion system of claim 1, wherein the on-board diagnostics protocol converter unit further includes one or more OBD interpreter chips for decoding the unknown OBD protocol and the known OBD protocol.

10. The unknown on-board diagnostics (OBD) protocol interpreter and conversion system of claim 1, wherein the unknown OBD protocol is in a region-specific, model-specific, or maker-specific custom OBD data format, which is not recognizable by a generic OBD data reader unit.

11. The unknown on-board diagnostics (OBD) protocol interpreter and conversion system of claim 1, wherein the on-board diagnostics protocol converter unit interprets the known OBD protocol and the unknown OBD protocol from the raw OBD data stream, and generates a different OBD data format that is compatible to various components of a remote vehicle OBD monitoring system.

12. The unknown on-board diagnostics (OBD) protocol interpreter and conversion system of claim 1, wherein the vehicle is a truck, a van, a bus, a taxi, or a passenger vehicle.

13. The unknown on-board diagnostics (OBD) protocol interpreter and conversion system of claim 1, wherein the data communication network is a cellular network, a satellite network, or a land-mobile radio network.

* * * * *